US012181278B2

United States Patent
Yoshioka et al.

(10) Patent No.: US 12,181,278 B2
(45) Date of Patent: Dec. 31, 2024

(54) MEASURING APPARATUS, ON-CHIP INSTRUMENTATION DEVICE AND MEASURING METHOD

(71) Applicant: Nippon Telegraph and Telephone Corporation, Tokyo (JP)

(72) Inventors: Katsumasa Yoshioka, Musashino (JP); Masayuki Hashisaka, Musashino (JP); Koji Muraki, Musashino (JP); Norio Kumada, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 246 days.

(21) Appl. No.: 17/800,612

(22) PCT Filed: Feb. 25, 2020

(86) PCT No.: PCT/JP2020/007471
§ 371 (c)(1),
(2) Date: Aug. 18, 2022

(87) PCT Pub. No.: WO2021/171367
PCT Pub. Date: Sep. 2, 2021

(65) Prior Publication Data
US 2023/0077185 A1 Mar. 9, 2023

(51) Int. Cl.
*G01B 9/02* (2022.01)
*G01B 9/02003* (2022.01)
(Continued)

(52) U.S. Cl.
CPC ..... *G01B 9/02051* (2013.01); *G01B 9/02003* (2013.01); *G01B 9/02069* (2013.01); *G01R 19/0007* (2013.01)

(58) Field of Classification Search
CPC ............ G01B 9/02003; G01B 9/02051; G01N 21/3581; G01R 15/24; G01R 19/0007
See application file for complete search history.

(56) References Cited

U.S. PATENT DOCUMENTS

| | | | |
|---|---|---|---|
| 11,054,455 B2 * | 7/2021 | Hisatake | G01R 29/08 |
| 2017/0292875 A1 * | 10/2017 | Song | G01N 21/39 |
| 2017/0307520 A1 * | 10/2017 | Hepp | G01N 21/39 |

FOREIGN PATENT DOCUMENTS

KR 20180005447 A * 1/2018 ......... G01N 21/3581

OTHER PUBLICATIONS

Saeedkia, Daryoosh et al. "Analysis and Design of a Photoconductive Integrated Photomixer/Antenna for Terahertz Applications". IEEE Journal of Quantum Electronics, vol. 41, No. 2, Feb. 2005, pp. 234-241. (Year: 2005).*

(Continued)

*Primary Examiner* — Michael A Lyons
(74) *Attorney, Agent, or Firm* — Workman Nydegger

(57) ABSTRACT

This application discloses a measurement apparatus that does not use a femtosecond laser light source and a delay stage. The measurement apparatus mixes a first laser light from a first CW laser light source and a second laser light from a second CW laser light source to generate an interference light having a beat in a range from GHz to THz and demultiplexes the interference light into a pump light and a probe light. A generating photoconductive antenna is irradiated with the pump light, and a detecting photoconductive antenna is irradiated with the probe light. A current value of an electromagnetic wave propagating through a waveguide connecting the generating photoconductive antenna and the detecting photoconductive antenna is measured using a current system connected to the detecting photoconductive antenna.

8 Claims, 7 Drawing Sheets

(51) Int. Cl.
*G01B 9/02055* (2022.01)
*G01R 19/00* (2006.01)

(56) References Cited

OTHER PUBLICATIONS

Christopher Russell et al., *Spectroscopy of Polycrystalline Material Using Thinned-Substrate Planar Goubau Line at Cryogenic Temperatures*, Lab on a Chip, Aug. 2, 2013, vol. 13, pp. 4065-4070.

* cited by examiner

Fig. 2 --Prior Art--

MEASURING APPARATUS, ON-CHIP INSTRUMENTATION DEVICE AND MEASURING METHOD

TECHNICAL FIELD

The present application relates to quantitative evaluation of electrical transport characteristics that contribute to development of electronic devices, and more particularly, to a measurement apparatus, an on-chip measurement device, and a measurement method having high frequency resolution in broadband for measuring a current.

BACKGROUND ART

For further speed-up of electronics, there is a need to develop a technique to evaluate current responses in broadband from a GHz band, which is an operating range of existing high frequency devices, to a THz band, which is an unexplored range, in an identical measurement system and with high frequency resolution.

A known technique for evaluating ultra-high speed transport characteristics in the THz range which is difficult to reach by using electronics in the related art includes on-chip measurement making use of a pump-probe spectroscopy using femtosecond laser pulses (see NPL 1, for example).

FIG. 1 is a diagram illustrating a configuration of a measurement apparatus for performing on-chip measurement making use of the pump-probe spectroscopy using femtosecond laser pulses. A measurement apparatus 10 is constituted by a combination of an optical system using a femtosecond pulse laser light source 11 and an on-chip measurement device 16.

The optical system includes the femtosecond pulse laser light source 11, an optical demultiplexer 13, and a delay stage 12.

The optical demultiplexer 13 can be, for example, a half mirror or a one-input-two-output optical coupler (also referred to as a 1×2 optical coupler) but is not limited thereto.

The delay stage 12 can be, for example, a motorized linear translation stage but is not limited thereto.

The on-chip measurement device 16 includes a generating photoconductive antenna 18a, a detecting photoconductive antenna 18d, and a pair of waveguides 17a and 17b, each formed on a substrate.

The generating photoconductive antenna 18a includes a photoconductive semiconductor film 18b and a pair of electrodes 18c disposed apart from each other. The photoconductive semiconductor film 18b can be, for example, gallium arsenide (GaAs) grown in a low temperature but is not limited thereto. The pair of electrodes 18c is constituted by a pair of metal wires. The pair of electrodes 18c can be a dipole type or a bow-tie type but is not limited thereto. The pair of electrodes 18c is disposed in such a manner that one end thereof overlaps with the photoconductive semiconductor film 18b. A power source (not illustrated) is connected to the other end of the pair of electrodes 18c, to which a DC voltage is applied.

Similar to the generating photoconductive antenna 18a, the detecting photoconductive antenna 18d includes a photoconductive semiconductor film 18e and a pair of electrodes 18f, the electrodes disposed apart from each other. The pair of electrodes 18f is constituted by a pair of metal wires. The pair of electrodes 18f can be a dipole type or a bow-tie type but is not limited thereto. Similar to the pair of electrodes 18c, the pair of electrodes 18f includes a pair of metal wires disposed apart from each other. The pair of electrodes 18f is disposed in such a manner that one end thereof overlaps with the photoconductive semiconductor film 18e. An ammeter (not illustrated) is connected to the other end of the pair of electrodes 18f.

The generating photoconductive antenna 18a and the detecting photoconductive antenna 18d are disposed apart from each other. The waveguide 17a is disposed in contact with and/or overlapping with the photoconductive semiconductor film 18b and the photoconductive semiconductor film 18e and connects the generating photoconductive antenna 18a and the detecting photoconductive antenna 18d.

The waveguides 17a and 17b constitute a stripline waveguide. The waveguides 17a and 17b may be grounded together.

A material of the electrodes and the waveguides may be gold but is not limited thereto.

A femtosecond pulse laser from the femtosecond pulse laser light source 11 is demultiplexed by the optical demultiplexer 13 into a pump light and a probe light.

The pump light, which is a femtosecond pulse laser, is applied between the pair of electrodes 18c to excite the photoconductive semiconductor film 18b. At this time, an instantaneous current flows between the pair of electrodes 18c, generating a terahertz electromagnetic wave pulse. The generated terahertz electromagnetic wave pulse 19 passes through the waveguide 17a and the waveguide 17b.

The probe light, which is a femtosecond pulse laser, is guided to the delay stage 12 and is applied between the pair of electrodes 18f via the delay stage 12 to excite the photoconductive semiconductor film 18e. At this time, an instantaneous current flows between the pair of electrodes 18f. When the terahertz electromagnetic wave pulse 19 is incident on the detecting photoconductive antenna 18d at a timing overlapping with the probe light, an instantaneous potential difference proportional to an intensity of the terahertz electromagnetic wave pulse is generated between the pair of electrodes 18f. A current value is measured by the ammeter connected between the pair of electrodes 18f. A magnitude of the instantaneous current between the pair of electrodes 18f differs between the case where the terahertz electromagnetic wave pulse is incident on the detecting photoconductive antenna 18d and the case where the terahertz electromagnetic wave pulse is not incident on the detecting photoconductive antenna 18d.

The delay stage 12 is mechanically operated to change an optical path length of the probe light to control time delay of the probe light relative to the pump light, thereby allowing real-time measurement in the THz band in the measurement apparatus 10.

The ultra-high speed transport characteristics in the THz range can be evaluated by Fourier-transforming a measured signal (i.e., a measured current value) to obtain a spectrum of a high-frequency current.

FIG. 2 is a diagram illustrating a high-frequency current spectrum measured in NPL 1. Data of 0.1 THz (100 GHz) or less is difficult to be quantitatively evaluated. Furthermore, the frequency resolution is approximately tens of GHz.

CITATION LIST

Non Patent Literature

NPL 1: C. Russell, C. D. Wood, A. D. Burnett, L. Li, E. H. Linfield, A. G. Davies, and J. E. Cunningham, "Spectroscopy of polycrystalline materials using thinned-substrate planar Goubau line at cryogenic temperatures", Lab Chip, 13, 4065 (2013)

SUMMARY OF THE INVENTION

In the measurement apparatus illustrated in FIG. 1, it is essential to use the femtosecond pulse laser light source 11 and the delay stage 12, resulting in one or more of the following drawbacks.

The optical system is expensive and complicated, and thus versatility and stability are reduced.

A real-time signal is subjected to Fourier transformation to obtain a current spectrum, and thus it is difficult to quantitatively evaluate a current response of 100 GHz or less. As a result, it is impossible to measure broadband responses from the GHz band, which is a band of electronics in the related art, to the THz band.

The frequency resolution is determined by a reciprocal of a measurement time window, and thus it is difficult to obtain a frequency resolution higher than several GHz as a result of being limited by the operating range of the delay stage.

It is necessary to measure an entire real time signal to obtain a current spectrum, so that a total energy spectrum is measured even when only a specific frequency range is desired to be focused on, whereby it is impossible to improve a throughput in accordance with a purpose.

The present invention has been made in view of such problems, and an embodiment of the present invention is a measurement apparatus. The measurement apparatus includes: a first CW laser light source; a second CW laser light source; and a photomixer configured to mix a first laser light from the first CW laser light source and a second laser light from the second CW laser light source to generate an interference light having a beat in a range from GHz to THz; an optical demultiplexer configured to demultiplex the interference light to output a pump light and a probe light; and an on-chip measurement device. The on-chip measurement device includes: a generating photoconductive antenna; a detecting photoconductive antenna; a waveguide connecting the generating photoconductive antenna and the detecting photoconductive antenna; and an ammeter connected to the detecting photoconductive antenna. The generating photoconductive antenna is irradiated with the pump light, the detecting photoconductive antenna is irradiated with the probe light, and the ammeter measures a current value of an electromagnetic wave that propagates through the waveguide and reaches the detecting photoconductive antenna.

Another embodiment of the present invention is an on-chip measurement device. The on-chip measurement device includes a generating photoconductive antenna, a detecting photoconductive antenna, and a waveguide connecting the generating photoconductive antenna and the detecting photoconductive antenna. The generating photoconductive antenna is irradiated with a pump light, the detecting photoconductive antenna is irradiated with a probe light, and an electromagnetic wave propagates through the waveguide from the generating photoconductive antenna to the detecting photoconductive antenna. The waveguide includes a set of a first waveguide, a second waveguide, and a third waveguide, the second waveguide is divided into a first portion and a second portion, a gap is provided between the first portion and the second portion, and the gap functions as a filter that cuts noise of a DC component included in the electromagnetic wave.

Yet another embodiment of the present invention is a measurement method including: mixing two CW laser lights to generate an interference light having a beat in a range from GHz to THz; demultiplexing the interference light into a pump light and a probe light; applying the pump light to a transmitting photoconductive antenna and applying the probe light to the detecting photoconductive antenna; and measuring a current value between a pair of electrodes included in the detecting photoconductive antenna.

According to the embodiments of the present invention, it is possible to provide a measurement apparatus that does not use a femtosecond pulse laser light source and a delay stage, and a measurement method, a measurement with high frequency resolution is possible in broadband, or it is possible to perform measurement focusing only on a frequency range to be examined.

DESCRIPTION OF EMBODIMENTS

Hereinafter, embodiments of the present invention will be described with reference to the drawings. The same or similar reference signs indicate the same or similar elements, and repeated description is omitted. Specific numerical values used in the following description are exemplary and are not intended to be limiting.

Figure 1:
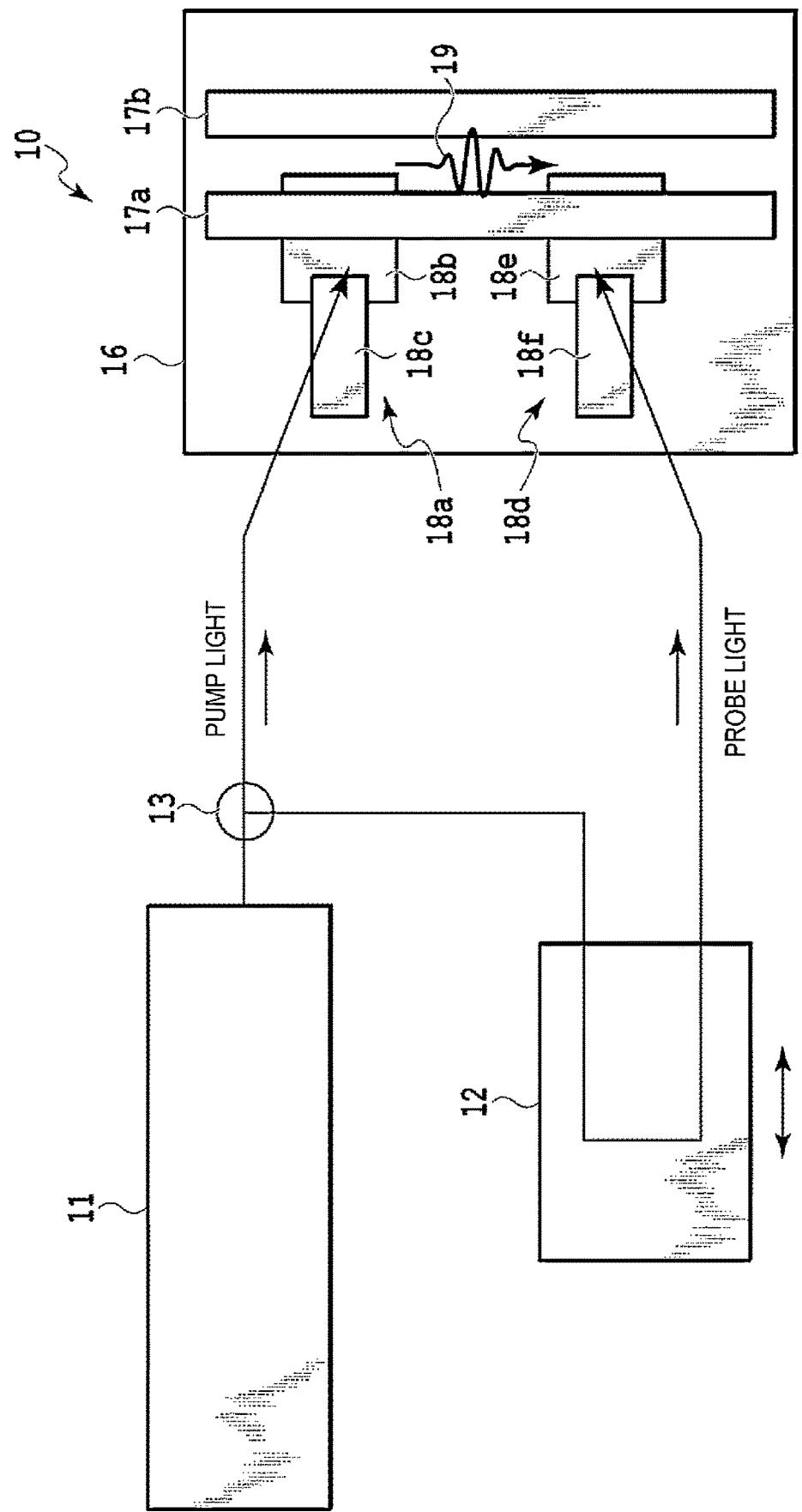
FIG. 1 is a diagram illustrating a configuration of a measurement apparatus for performing on-chip measurement making use of pump-probe spectroscopy using femtosecond laser pulses.

A measurement apparatus and a measurement method according to embodiments of the present invention described below do not use the femtosecond pulse laser light source 11 and the delay stage 12 used in the related-art technique described with reference to FIG. 1. Instead, the measurement apparatus and the measurement method according to the embodiments of the present invention use two continuous wave (CW) operation laser (CW laser) light sources. An interference light of two CW laser lights is used to resolve the above-mentioned drawbacks.

First Embodiment

Figure 3:
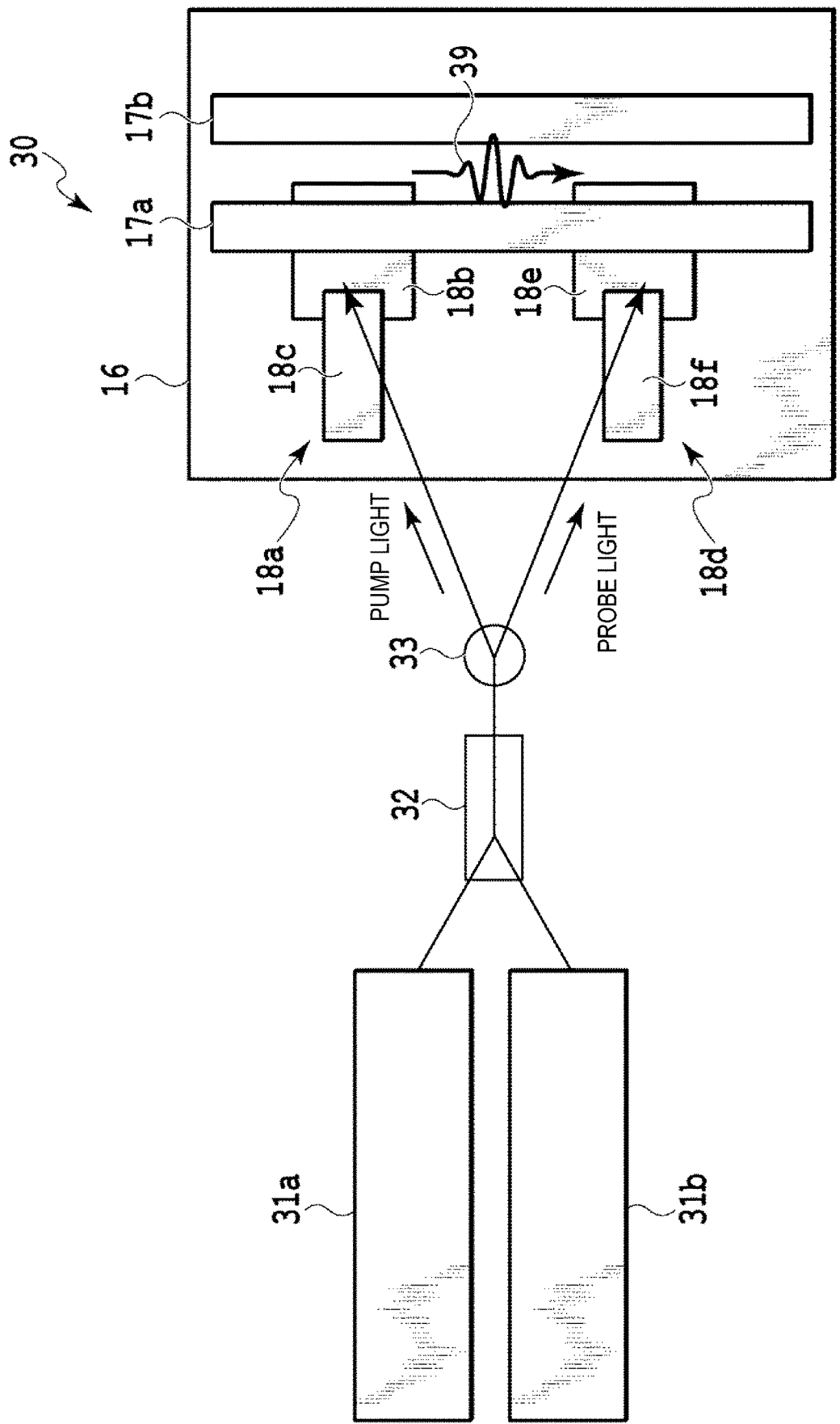
FIG. 3 is a diagram illustrating a configuration of a measurement apparatus according to an embodiment of the present invention.

FIG. 3 is a diagram illustrating a configuration of a measurement apparatus according to a first embodiment of the present invention. The measurement apparatus 30 illustrated in FIG. 3 includes two CW laser light sources 31a and 31b, a photomixer 32, an optical demultiplexer 33, and an on-chip measurement device 16.

The two CW laser light sources 31a and 31b can each be a distributed feedback (DFB) laser device capable of modulating wavelengths from 783 nm and to 785 nm. In each of the two CW laser light sources 31a and 31b, a center frequency of a CW laser light to be output can be varied to perform sweeping.

The photomixer 32 can be, for example, a two-input-one-output optical fiber coupler (2×1 optical fiber coupler) but is not limited thereto. The photomixer 32 inputs two CW laser lights each having a center frequency changed by each of the two CW laser light sources 31a and 31b and mixes the two CW laser lights having different center frequencies to output an interference light having a beat at a frequency in a GHz to THz range.

The optical demultiplexer 33 can be a one-input-two-output optical coupler (1×2 optical coupler) such as a half mirror, a prism, or a directional coupler but is not limited thereto. The optical demultiplexer 33 inputs the interference light having a beat at a frequency in the GHz to THz range output from the photomixer 32, and outputs a pump light and a probe light obtained by demultiplexing the interference light into two.

The on-chip measurement device 16 is the same as the configuration described with reference to FIG. 1, and thus description thereof will be omitted. Similar to FIG. 1, a pair of electrodes 18c has the other end connected to a power source (not illustrated), to which a DC voltage is applied. In addition, an ammeter (not illustrated) is connected to the other end of a pair of electrodes 18f, and a current value between the pair of electrodes 18c is measured. In order to obtain a spectrum of a high-frequency current of any device that is a non-measurement target, the on-chip measurement device 16 is disposed on a surface of the device or the like. The spectrum of the high-frequency current is used to evaluate current responses in broadband from a GHz band to a THz band in the non-measurement target.

The pump light obtained by demultiplexing the interference light having a beat at a frequency in the GHz to THz range is applied between the pair of electrodes 18c to excite a photoconductive semiconductor film 18b. At this time, an instantaneous current corresponding to a beat frequency of the pump light flows between the pair of electrodes 18c, and as a result, an electromagnetic wave 39 having a frequency from GHz to THz corresponding to the beat frequency of the pump light is generated. The generated electromagnetic wave 39 propagates through a waveguide 17a and a waveguide 17b.

The probe light obtained by demultiplexing the interference light having a beat at a frequency in the GHz-THz range is applied between the pair of electrodes 18f to excite a photoconductive semiconductor film 18e. Then, while the probe light is applied between the pair of electrodes 18f, an instantaneous current value is measured by the ammeter connected between the pair of electrodes 18f. The instantaneous current value differs between when the electromagnetic wave 39 having a frequency from GHz to THz reaches the detecting photoconductive antenna 18d and when the electromagnetic wave 39 does not reach the detecting photoconductive antenna 18d.

Second Embodiment

In the measurement apparatus 30 described above with reference to FIG. 3, it has been found that a large amount of DC component is included as noise in the electromagnetic wave 39 having a high frequency because the interference light of CW laser lights is used. This is due to the fact that the interference light of the CW laser lights continues to hit between the pair of electrodes 18c of the generating photoconductive antenna 18a, whereby off characteristics between the pair of electrodes 18c is deteriorated as compared to the measurement apparatus illustrated in FIG. 1.

In contrast, a present embodiment provides a measurement apparatus capable of eliminating noise of DC component included in the electromagnetic wave 39.

Figure 4:
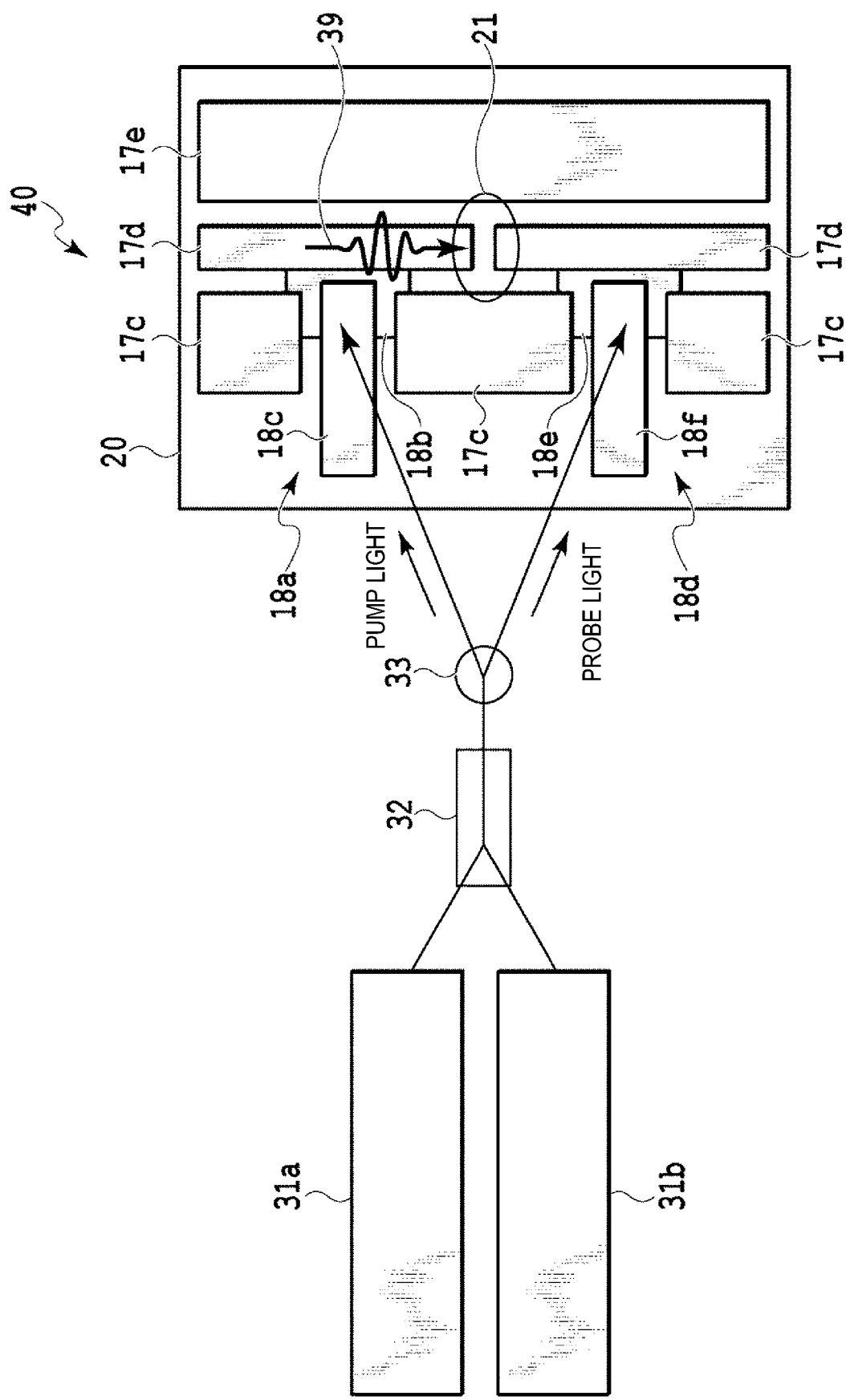
FIG. 4 is a diagram illustrating a configuration of a measurement apparatus according to another embodiment of the present invention.

FIG. 4 is a diagram illustrating a configuration of a measurement apparatus according to a second embodiment of the present invention. A measurement apparatus 40 illustrated in FIG. 4 includes two CW laser light sources 31a and 31b, a photomixer 32, an optical demultiplexer 33, and an on-chip measurement device 20.

The two CW laser light sources 31a and 31b, the photomixer 32, and the optical demultiplexer 33 are the same as those described with reference to FIG. 3, and thus description thereof will be omitted.

The on-chip measurement device 20 includes a generating photoconductive antenna 18a, a detecting photoconductive antenna 18d, and a set of waveguides 17c, 17d, and 17e, formed on a substrate.

The generating photoconductive antenna 18a and the detecting photoconductive antenna 18d are the same as those described with reference to FIG. 1, and thus description thereof will be omitted.

The set of waveguides 17c, 17d, and 17e extending in a propagation direction of an electromagnetic wave 39 constitutes a coplanar waveguide. A material of the waveguides may be gold but is not limited thereto. The waveguides 17c, 17d, and 17e may be grounded.

The set of waveguides 17c, 17d, and 17e electrically connect the generating photoconductive antenna 18a and the detecting photoconductive antenna 18d, and the electromagnetic wave 39 generated in the generating photoconductive antenna 18a propagates to the detecting photoconductive antenna 18d.

The waveguide 17c is divided into three. The generating photoconductive antenna 18a is disposed between two of the divided waveguides 17c, and the detecting photoconductive antenna 18d is disposed between other two of the divided waveguides 17c. Each of the divided waveguides 17c is disposed in such a manner that a portion thereof overlaps with a photoconductive semiconductor film 18b or 18e. Each of the divided waveguides 17c is disposed apart from the pair of electrodes 18c and the pair of electrodes 18f.

The waveguide 17d is divided into two which are disposed apart from each other. A spacing 21 between the two-divided waveguides 17d (also referred to as a length in the propagation direction of the electromagnetic wave 39, also referred to as a gap) is, for example, from 2 μm to 3 μm. Each of the divided waveguides 17d is disposed in such a manner that a portion thereof overlaps with the photoconductive semiconductor film 18b or 18e. Each of the divided waveguides 17d is disposed apart from the pair of electrodes 18c and the pair of electrodes 18f.

The waveguide 17e is not divided, does not overlap with the photoconductive semiconductor film 18b or 18e, and is disposed apart from the pair of electrodes 18c and the pair of electrodes 18f.

For example, the width of the waveguide 17d (the length in a direction orthogonal to the propagation direction of the electromagnetic wave 39) is 30 μm but is not limited thereto. Further, for example, a spacing between the waveguide 17c and the waveguide 17d and a spacing between the waveguide 17d and the waveguide 17e are equal to each other and 20 μm but are not limited thereto.

A spacing 21 between the two-divided waveguides 17d functions as a filter to remove noise of the DC component included in the electromagnetic wave 39.

Figure 5:
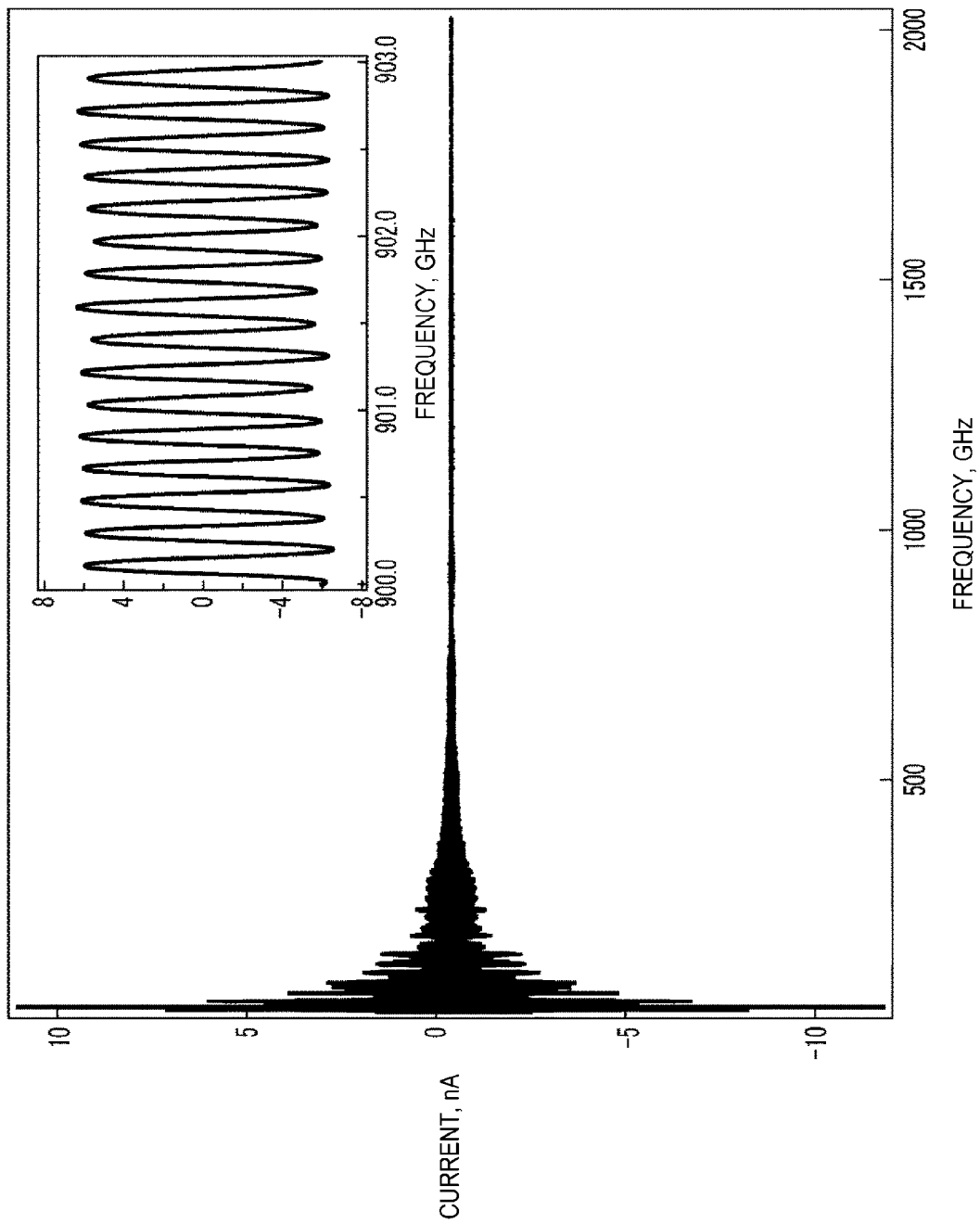
FIG. 5 is a diagram illustrating current values measured in the measurement apparatus illustrated in FIG. 4.

FIG. 5 is a diagram illustrating a current response measured while scanning a beat frequency of the interference light in the measurement apparatus 40 according to the present embodiment, and illustrates current values measured at a 10 MHz step in an ammeter (not illustrated) connected between the pair of electrodes 18f of the measurement apparatus 40 according to the present embodiment. An enlarged view of the current values from 900 GHz to 903 Ghz is also illustrated in FIG. 5. As can be seen from the enlarged view, a fine oscillation of approximately 200 MHz is observed. This fine oscillation of approximately 200 MHz is observed in not only 900 GHz to 903 Ghz but also in an entire band. A carrier wave of the oscillating signal indicates a phase of a high-frequency current, and an envelope of the oscillating signal indicates an intensity.

As described above, according to the measurement apparatus 40 of the present embodiment, it is possible to cut noise of the DC component and measure only the high-frequency current, and it is possible to detect a signal at a high signal-to-noise (SN) ratio as illustrated in FIG. 5.

Figure 2:
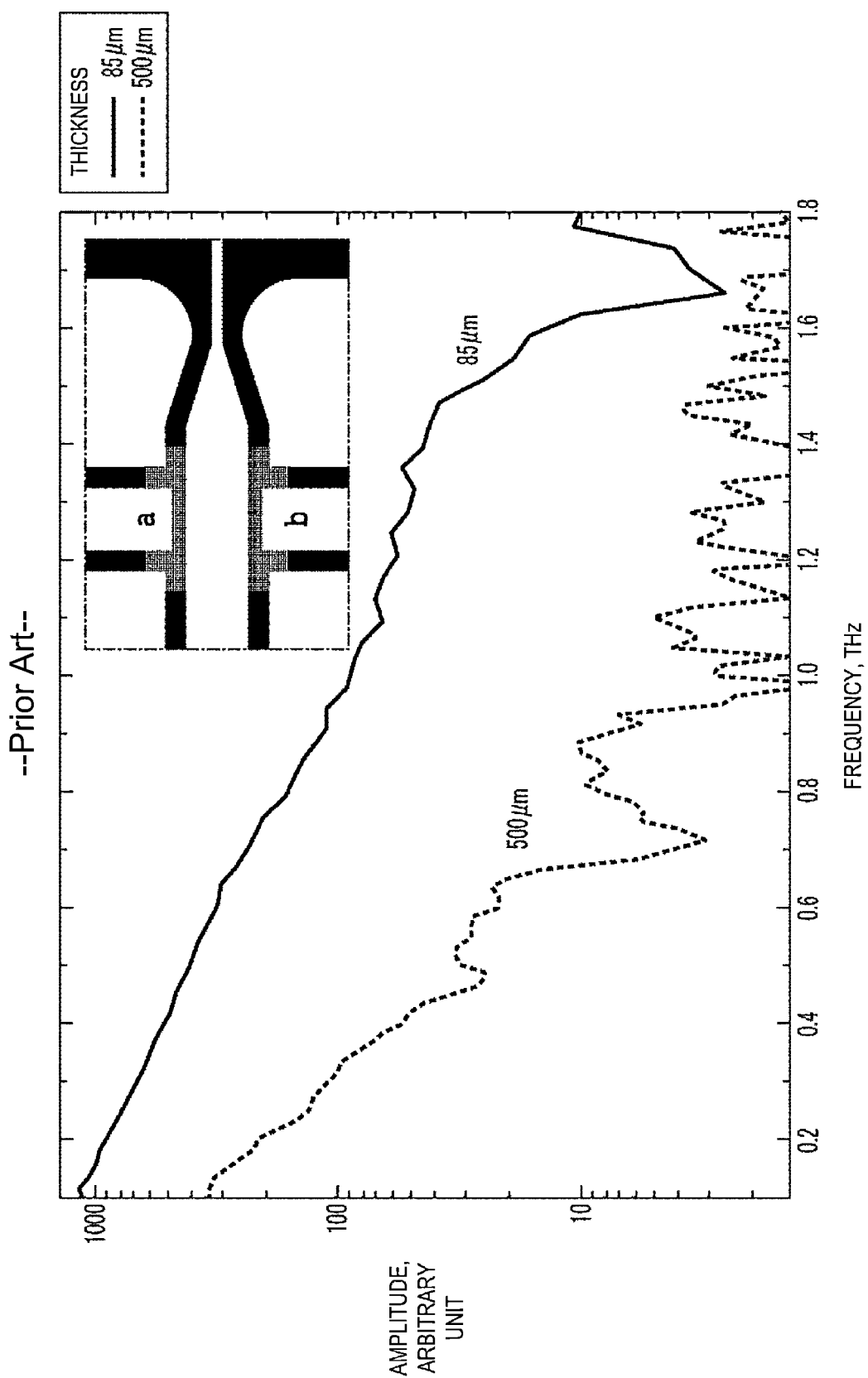
FIG. 2 is a diagram illustrating a high-frequency current spectrum measured in NPL 1.
Figure 6:
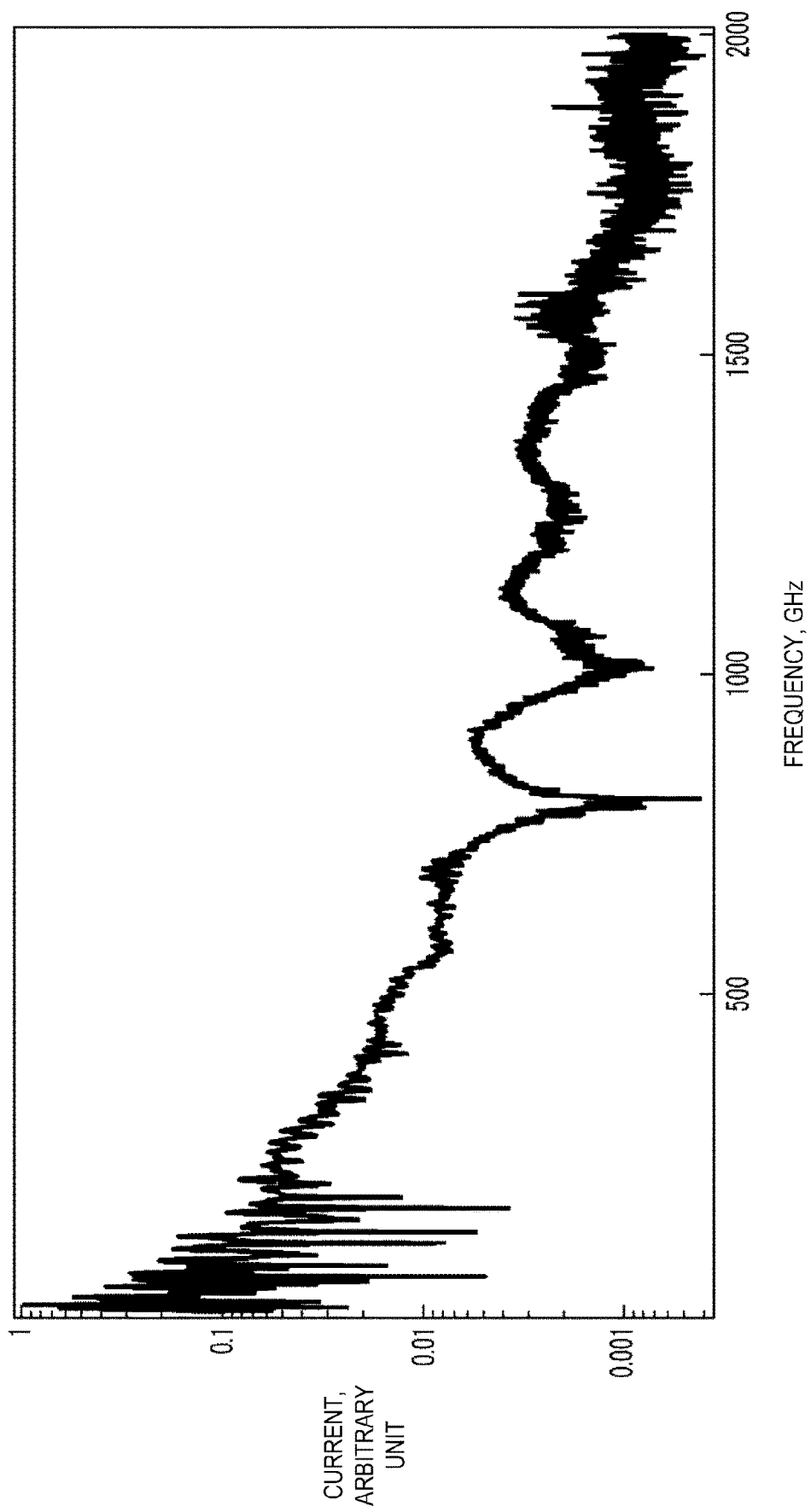
FIG. 6 is a diagram illustrating a high-frequency current spectrum measured in the measurement apparatus illustrated in FIG. 4.

FIG. 6 is a diagram illustrating a spectrum of a high-frequency current, which is a result of extracting an envelope of a current value illustrated in FIG. 5 by Hilbert transformation. The spectrum of the high-frequency current in FIG. 6 is the same as the spectrum of the high-frequency current obtained in the related-art technique illustrated in FIG. 2. As illustrated in FIG. 6, in the measurement apparatus 40 of the present embodiment, measurement can be made in broadband ranging from 5 GHz to approximately 1.5 THz or higher. The frequency resolution in this measurement is 10 MHz determined by a step width of measurement. Note that a fine oscillation structure seen in FIG. 6 is caused by Fabry Perot interference.

Third Embodiment

Figure 7:
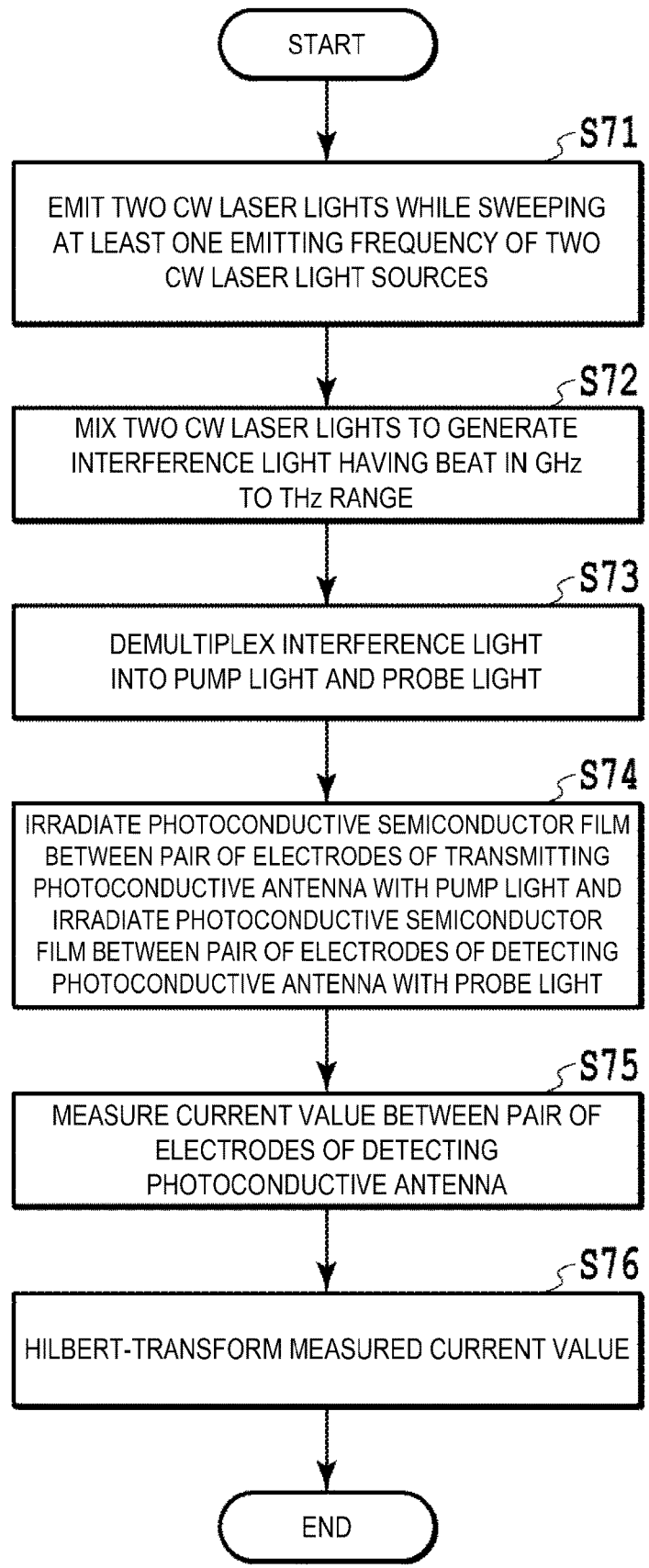
FIG. 7 is a flowchart of a measurement method according to an embodiment of the present invention.

FIG. 7 is a flowchart of a measurement method according to a third embodiment of the present invention. The measurement method of the present embodiment can be performed by the measurement apparatus 30 described with reference to FIG. 3 or the measurement apparatus 40 described with reference to FIG. 4.

In step S71, the two CW laser light sources 31a and 31b emit two CW laser lights while sweeping at least one emitting frequency. A range of the emitting frequency to be swept, the number of the CW laser light sources performing sweeping may be determined by a frequency range to be examined.

In step S72, the photomixer 32 mixes the two CW laser lights to generate an interference light having a beat in a GHz to THz range.

In step S73, the optical demultiplexer 33 demultiplexes the interference light into a pump light and a probe light.

In step S74, the photoconductive semiconductor film 18b between the pair of electrodes 18c of the generating photoconductive antenna 18a is irradiated with the pump light, and the photoconductive semiconductor film 18e between the pair of electrodes 18f of the detecting photoconductive antenna 18d is irradiated with the probe light.

In step S75, a current value between the pair of electrodes 18f of the detecting photoconductive antenna 18d is measured.

In step S76, a computer Hilbert-transforms the measured current value.

The effects of the measurement apparatus and the measurement method according to the embodiments of the present invention described above are as follows.

A femtosecond laser light source and a delay stage are not used, so that an optical system becomes inexpensive and simple, and a more compact and robust apparatus design is possible.

The measurement band is determined by the frequency difference between the CW laser lights from the two CW laser light sources, so that quantitative measurement is possible even in a frequency range of 10 GHz or less and it is possible to evaluate current responses in broadband from a GHz band to a THz band.

The frequency resolution of the measurement apparatus is determined by a line width of a CW laser light, so that it is possible to achieve high frequency resolution of several MHz.

The measurement frequency can be selectively controlled, so that it is possible to improve throughput by performing measurement focusing only on a frequency range to be examined.

The invention claimed is:

1. A measurement apparatus comprising:
   a first CW laser light source;
   a second CW laser light source;
   a photomixer configured to mix a first laser light from the first CW laser light source and a second laser light from the second CW laser light source to generate an interference light having a beat in a range from GHz to THz;
   an optical demultiplexer configured to demultiplex the interference light to output a pump light and a probe light; and
   an on-chip measurement device including a generating photoconductive antenna, a detecting photoconductive antenna, a waveguide connecting the generating photoconductive antenna and the detecting photoconductive antenna, and an ammeter connected to the detecting photoconductive antenna, wherein
   the generating photoconductive antenna is irradiated with the pump light, the detecting photoconductive antenna is irradiated with the probe light, and the ammeter is configured to measure a current value of an electromagnetic wave that propagates through the waveguide and reaches the detecting photoconductive antenna.

2. The measurement apparatus according to claim 1, wherein
   at least one of the first CW laser light source or the second CW laser light source is modulable in wavelength.

3. The measurement apparatus according to claim 2, wherein
   the waveguide includes a set of a first waveguide, a second waveguide, and a third waveguide,
   the second waveguide is divided into a first portion and a second portion, and a gap is provided between the first portion and the second portion, and
   the gap serves as a filter configured to cut noise of a DC component included in the electromagnetic wave.

4. The measurement apparatus according to claim 1, wherein
   the waveguide includes a set of a first waveguide, a second waveguide, and a third waveguide,
   the second waveguide is divided into a first portion and a second portion, and a gap is provided between the first portion and the second portion, and
   the gap serves as a filter configured to cut noise of a DC component included in the electromagnetic wave.

5. The measurement apparatus according to claim 4, wherein
- the first waveguide is divided into a first portion, a second portion, and a third portion,
- the generating photoconductive antenna is disposed between the first portion of the first waveguide and the second portion of the first waveguide, and
- the detecting photoconductive antenna is disposed between the second portion of the first waveguide and the third portion of the first waveguide.

6. An on-chip measurement device comprising:
- a generating photoconductive antenna;
- a detecting photoconductive antenna; and
- a waveguide connecting the generating photoconductive antenna and the detecting photoconductive antenna, wherein
- the generating photoconductive antenna is irradiated with a pump light, the detecting photoconductive antenna is irradiated with a probe light, and an electromagnetic wave propagates through the waveguide from the generating photoconductive antenna to the detecting photoconductive antenna, and
- the waveguide includes a set of a first waveguide, a second waveguide, and a third waveguide,
- the second waveguide is divided into a first portion and a second portion, and a gap is provided between the first portion and the second portion, and
- the gap serves as a filter configured to cut noise of a DC component included in the electromagnetic wave.

7. A measurement method comprising:
- mixing two CW laser lights to generate an interference light having a beat in a range from GHz to THz;
- demultiplexing the interference light into a pump light and a probe light;
- irradiating a transmitting photoconductive antenna with the pump light, and irradiating a detecting photoconductive antenna with the probe light; and
- measuring a current value between a pair of electrodes included in the detecting photoconductive antenna.

8. The measurement method according to claim 7, further comprising Hilbert-transforming the current value measured.

* * * * *